(12) United States Patent
Park et al.

(10) Patent No.: US 12,356,638 B2
(45) Date of Patent: Jul. 8, 2025

(54) METAL-INSULATOR-METAL CAPACITOR STRUCTURE WITH ENLARGED CAPACITOR AREA

(71) Applicant: International Business Machines Corporation, Armonk, NY (US)

(72) Inventors: Chanro Park, Clifton Park, NY (US); Koichi Motoyama, Clifton Park, NY (US); Kenneth Chun Kuen Cheng, Shatin (HK); Chih-Chao Yang, Glenmont, NY (US)

( * ) Notice: Subject to any disclaimer, the term of this patent is extended or adjusted under 35 U.S.C. 154(b) by 700 days.

(21) Appl. No.: 17/457,747

(22) Filed: Dec. 6, 2021

(65) Prior Publication Data

US 2023/0178588 A1 Jun. 8, 2023

(51) Int. Cl.
*H10D 1/00* (2025.01)
*H10D 1/68* (2025.01)

(52) U.S. Cl.
CPC ............ *H10D 1/043* (2025.01); *H10D 1/042* (2025.01); *H10D 1/692* (2025.01); *H10D 1/716* (2025.01)

(58) Field of Classification Search
CPC ............ H01L 23/5223; H01L 23/5383; H01L 23/5386; H01L 28/90–92; H10D 1/665; H10D 1/047; H10D 1/716; H10D 1/043; H10D 1/042; H10D 1/692
See application file for complete search history.

(56) References Cited

U.S. PATENT DOCUMENTS

| | | | |
|---|---|---|---|
| 6,451,667 B1 | 9/2002 | Ning | |
| 7,763,925 B2 | 7/2010 | Hong | |
| 8,856,715 B1 | 10/2014 | Stephens et al. | |
| 9,252,204 B2 | 2/2016 | Adkisson et al. | |
| 9,324,780 B2 | 4/2016 | Jen et al. | |
| 10,043,863 B2 * | 8/2018 | Leobandung | H10D 1/716 |
| 10,396,147 B2 * | 8/2019 | Leobandung | H10D 1/716 |
| 11,450,733 B2 * | 9/2022 | Yeong | H01L 23/5383 |
| 2009/0108403 A1 * | 4/2009 | Gogoi | H10D 1/042 |
| | | | 257/532 |
| 2018/0277624 A1 | 9/2018 | Schultz | |
| 2018/0323255 A1 | 11/2018 | Cheng et al. | |

OTHER PUBLICATIONS

Anonymous, "Method and structure for forming FEOL on-chip MIM capacitor," an IP.com Prior Art Database Technical Disclosure, IP.com No. IPCOM000245179D, Feb. 17, 2016, 6 pgs.
Anonymous, "Method and Structure of forming Vertical CMOS device with MIM capacitor," an IP.com Prior Art Database Technical Disclosure, IP.com No. IPCOM000253192D, Mar. 13, 2018, 7 pgs.

(Continued)

*Primary Examiner* — Jose R Diaz
(74) *Attorney, Agent, or Firm* — Kimberly Zillig (57) ABSTRACT

A MIM capacitor and related methods of fabricating the MIM capacitor. The MIM capacitor includes a bottom capacitor plate including a plurality of trenches defined therein, and a top capacitor plate. The MIM capacitor also includes a capacitor insulating layer disposed between the top capacitor plate and the bottom capacitor plate and within the plurality of trenches. Further, the MIM capacitor includes a first electrode electrically connected to the bottom capacitor plate, and a second electrode electrically connected to the top capacitor plate.

7 Claims, 5 Drawing Sheets

(56) References Cited

OTHER PUBLICATIONS

Auth et al., "A 22nm High Performance and Low-Power CMOS Technology Featuring Fully-Depleted Tri-Gate Transistors, Self-Aligned Contacts and High Density MIM Capacitors," 2012 Symposium on VLSI Technology (VLSIT), 2012, pp. 131-132, doi: 10.1109/VLSIT.2012.6242496.

Fischer et al., "Low-k Interconnect Stack with multi-layer Air Gap and Tri-Metal-Insulator-Metal Capacitors for 14nm High Volume Manufacturing," 2015 IEEE International Interconnect Technology Conference and 2015 IEEE Materials for Advanced Metallization Conference (IITC/MAM), 2015, pp. 5-8, doi: 10.1109/IITC-MAM.2015.7325600.

Liao et al., "A manufacturable interposer MIM decoupling capacitor with robust thin high-K dielectric for heterogeneous 3D IC CoWoS wafer level system integration," 2014 IEEE International Electron Devices Meeting, 2014, pp. 27.3.1-27.3.4, doi: 10.1109/IEDM.2014.7047119.

* cited by examiner

METAL-INSULATOR-METAL CAPACITOR STRUCTURE WITH ENLARGED CAPACITOR AREA

BACKGROUND

The present disclosure relates generally to semiconductor integrated circuits, and more particularly to a semiconductor metal-insulator-metal capacitor, and a method of fabricating the same.

A metal-insulator-metal (MIM) capacitor (sometimes referred to as a "MIMCAP") is a structure that typically includes electrically conductive material layers (often referred to as "plates" or "electrodes") separated and insulated from each other by an insulator material (e.g., a dielectric layer) for storing a charge. MIM capacitors typically provide low voltage coefficients and a low series resistance, and, therefore, are often used in complementary metal-oxide-semiconductor (CMOS) applications.

The semiconductor industry continues to improve the integration density of various electronic components (e.g., transistors, diodes, resistors, capacitors, etc.) by continual reductions in minimum feature size, which allows more components to be integrated into a given area. These smaller electronic components may require smaller packages that utilize less area than packages of the past, in some applications.

SUMMARY

According to some embodiments of the disclosure, there is provided a MIM capacitor. The MIM capacitor includes a bottom capacitor plate including a plurality of trenches defined therein, and a top capacitor plate. The MIM capacitor also includes a capacitor insulating layer disposed between the top capacitor plate and the bottom capacitor plate and within the plurality of trenches. Further, the MIM capacitor includes a first electrode electrically connected to the bottom capacitor plate, and a second electrode electrically connected to the top capacitor plate.

According to some embodiments of the disclosure, there is provided a method of fabricating a metal-insulator-metal (MIM) capacitor. The method includes forming a bottom capacitor plate over an upper surface of a dielectric layer including a plurality of trenches defined therein, wherein the plurality of trenches are configured to provide the desired capacitance density of the MIM capacitor. The method also includes providing a top capacitor plate, and disposing a capacitor insulating layer between the top and bottom capacitor plates and within the plurality of trenches. The method further includes electrically connecting a first electrode to the bottom capacitor plate, and electrically connecting a second electrode to the top capacitor plate.

According to some embodiments of the disclosure, there is provided a method of fabricating a metal-insulator-metal (MIM) capacitor. The method includes providing a dielectric layer, forming a hardmask layer on an upper surface of the dielectric layer, forming a plurality of mandrel lines on an upper surface of the hardmask layer, and forming a conformal layer over the plurality of mandrel lines and the hardmask layer. The method also includes etching portions of the conformal layer from top portions of the mandrel lines and from any portion of the hardmask layer that is exposed, wherein other portions of the conformal layer that remain on the hardmask layer form a plurality of spacers. The method includes removing the plurality of mandrel lines, and forming a non-conformal layer on top portions of the plurality of spacers and on top portions of the hardmask layer which are located outward relative to the plurality of spacers. The method further includes etching portions of the hardmask layer located between the plurality of spacers, and etching portions of the dielectric layer located between the plurality of spacers to form a plurality of trenches in the dielectric layer. In addition, the method includes removing the hardmask layer from the dielectric layer. Further, the method includes forming a bottom capacitor layer over an upper surface of the dielectric layer and within the plurality of trenches, forming an insulating layer on an upper surface of the bottom capacitor layer, forming a top capacitor layer on an upper surface of the insulating layer, wherein the top capacitor layer fills the plurality of trenches, forming a first electrode electrically connected to the bottom capacitor layer, and forming a second electrode electrically connected to the top capacitor layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate to semiconductor integrated circuits, and more particularly to a semiconductor MIM capacitor structure, and a method of fabricating the same. While the present disclosure is not necessarily limited to such applications, various aspects of the disclosure can be appreciated through a discussion of various examples using this context.

Embodiments described in the disclosure provide an efficient MIM capacitor that can be formed in an insulative substrate as part of back end of line (BEOL) processes. Decoupling capacitors in BEOL processes enable mitigation of high frequency noise. High capacitance densities (e.g., a capacitance density of greater than 200 nano-farads per millimeter squared ($nF/mm^2$)) are desired, given the size of a capacitor in an integrated circuit (IC) is often limited to a relatively small, allotted footprint. Increasing the capacitance density is desired in order to supply the same capacitance as a larger capacitor in a smaller-sized capacitor. The disclosed MIM capacitor includes an enlarged capacitor area by varying the topography of the capacitor, which results in increasing the capacitance density without increasing the footprint of the capacitor. Some embodiments can increase the effective capacitive area (and also capacitance density) for a specified footprint size by including a plurality of trenches formed in the MIM capacitor structure. The capacitance density can also be modulated by varying the number and/or the depth of the trenches. A method of fabricating the MIM capacitor having such a structure is also disclosed.

For the sake of brevity, conventional techniques related to semiconductor device and IC fabrication may or may not be described in detail herein. Moreover, the various tasks and process steps or operations described herein can be incorporated into a more comprehensive procedure or process having additional operations or functionality not described in detail herein. In particular, various operations in the manufacture of semiconductor devices and semiconductor-based ICs are well known and so, in the interest of brevity, many conventional operations will only be mentioned briefly herein or will be omitted entirely without providing the well-known process details.

Turning now to an overview of the technologies that are more specifically relevant to aspects of the present disclosure, advancements in CMOS technologies have facilitated the production of semiconductor devices that implement increased transistor switching speeds with higher device densities on a semiconductor wafer. Large current spikes can occur due to a large number of "simultaneous" switching events in the circuit within a short period of time, which can cause considerable current-resistance drops and noise over the power supply network. Voltage fluctuations and power supply noise can impact the signal integrity, speed, and reliability of these devices. To mitigate high frequency noise in high-speed semiconductor technologies, on-chip MIM capacitors can be used. The MIM capacitors can compensate for voltage fluctuations and noise by delivering charges to the power-supply network and minimizing noise propagation.

Figure 1:
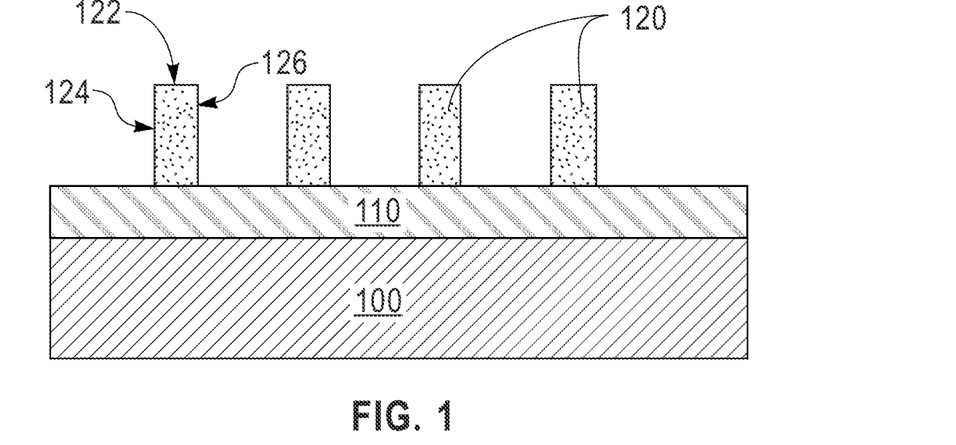
FIG. 1 is a cross-sectional view of a schematic of a structure at a first of successive fabrication operations of a method to make a MIM capacitor, in accordance with embodiments of the disclosure.

An example method of fabricating the disclosed MIM capacitor having an enlarged capacitor area is shown in cross-sectional views at successive fabrication stages in FIGS. 1-15. In FIG. 1, an interlayer dielectric layer 100 is shown. The interlayer dielectric layer 100 can be comprised of an electrically-insulating dielectric material, such as hydrogen-enriched silicon oxycarbide (SiCOH) or another type of low-k dielectric material, deposited by chemical vapor deposition (CVD). The interlayer dielectric layer 100 can be deposited on a substrate (not shown) that includes device structures fabricated by front-end-of-line (FEOL) processing to form an IC. A hardmask layer 110 is shown deposited on an upper surface of the interlayer dielectric layer 100, and can be formed using a deposition process such as thermal growth, CVD, plasma vapor deposition (PVD), etc. The hardmask layer 110 can be comprised of any suitable dielectric material, such as silicon nitride, or silicon oxide, etc., for example.

Deposited or formed on the hardmask layer 110 is a mandrel, which can be formed using a mandrel patterning process. The example mandrel shown in FIG. 1 includes mandrel lines 120. The mandrel lines 120 can be comprised of a dielectric material, such as a low-temperature oxide (LTO) of silicon or another material used to form such lines using multiple patterning processes, such as self-aligned double-patterning (SADP) or self-aligned quadruple-patterning (SAQP) processes or self-aligned octuple patterning (SAOP) processes. Other mandrel patterning processes are contemplated, however, and are not limited to those disclosed herein. The mandrel lines 120 shown comprise a plurality of parallel lines that can eventually lead to formation of parallel trenches in the interlayer dielectric layer 100 (by method operations described below). Other numbers of and configurations of mandrel lines 120 are also contemplated, and are not limited to those shown herein.

Figure 2:
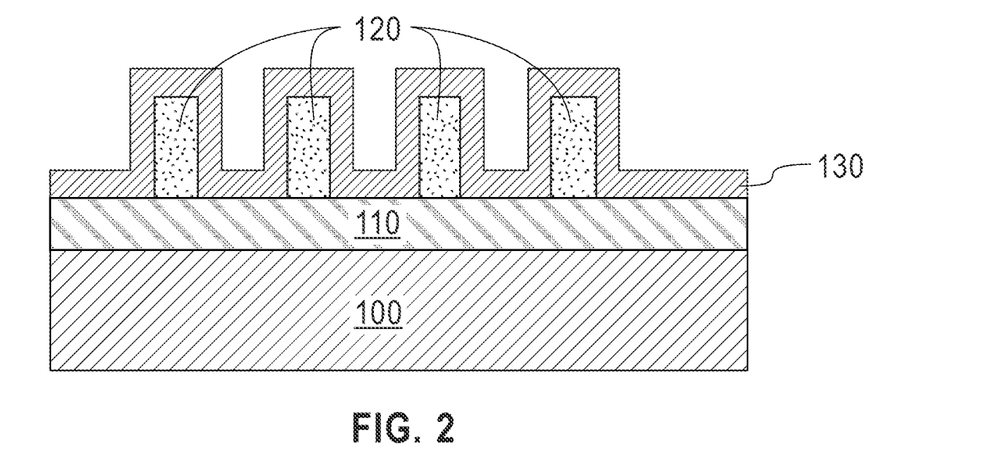
FIG. 2 is a cross-sectional schematic view illustrating a process operation following that of FIG. 1.

FIG. 2 shows a next operation in the described method of fabrication after that of FIG. 1, in which a spacer layer 130 is deposited over the mandrel lines 120 and hardmask layer 110. The spacer layer 130 is deposited in order to cover a top portion 122, and a first sidewall 124 and a second sidewall 126 (see FIG. 1), of each of the plurality of mandrel lines 120, and also portions of an upper surface of the hardmask layer 110 between and outward relative to the mandrel lines 120. The spacer layer 130 can be a conformal layer deposited by any deposition technique, such as CVD or atomic layer deposition (ALD), for example. However, any suitable technique for forming a conformal layer is contemplated. The spacer layer 130 can be comprised of an oxide of silicon, an oxide of titanium, or other dielectric material, for example. The thickness of the spacer layer 130 is generally uniform, and uniform both in the x- and y-directions (i.e., horizontal and vertical directions).

Figure 3:
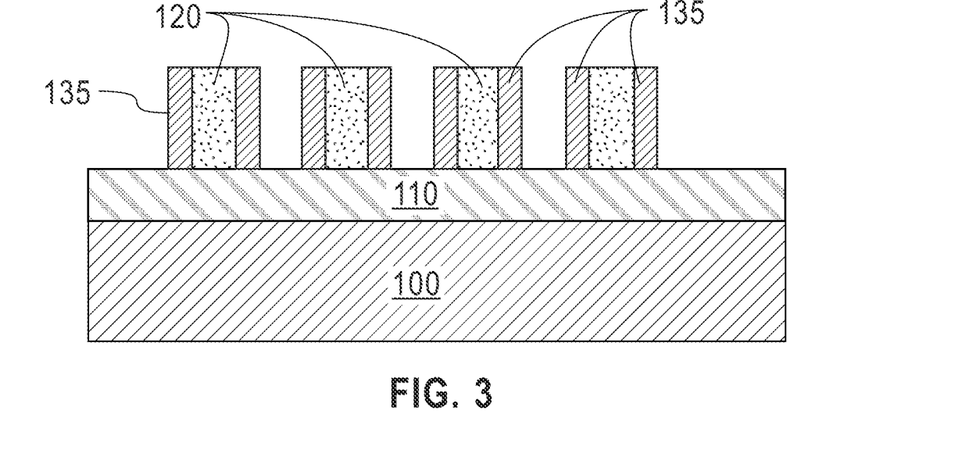
FIG. 3 is a cross-sectional schematic view illustrating a process operation following that of FIG. 2.

FIG. 3 shows a next operation in the method of fabrication after that of FIG. 2, which is after an etching of the spacer layer 130 has been performed. The spacer layer 130, as in FIG. 2, can be etched using any technique, such as directional dry etching, wet etching, and/or other etching methods. After the etching process has been completed, the portions of the spacer layer 130 that remain are attached to first and second sidewalls 124, 126 of the mandrel lines 120.

Figure 4:
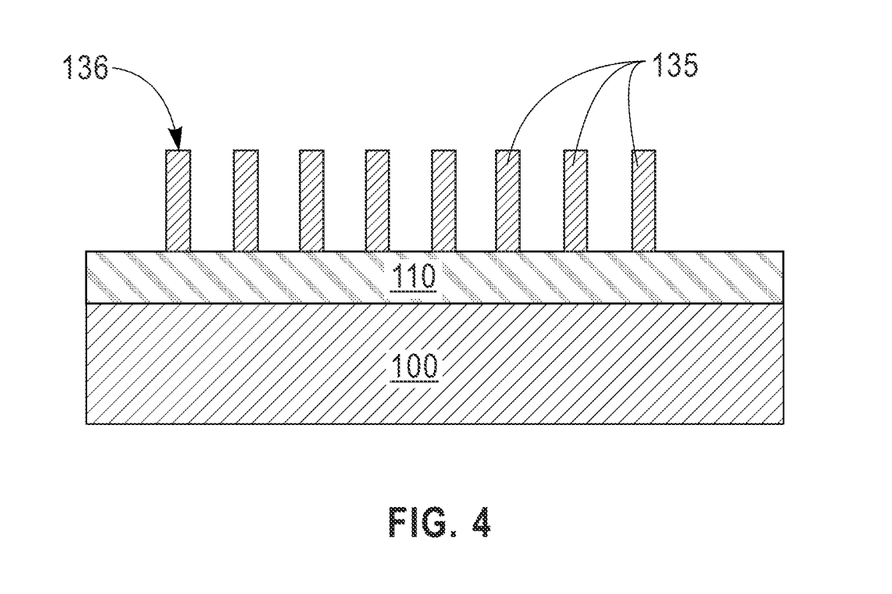
FIG. 4 is a cross-sectional schematic view illustrating a process operation following that of FIG. 3.

FIG. 4 shows the structure after the mandrel, including mandrel lines 120, has been pulled or removed. The mandrel pull process can be either a dry or a wet process. After mandrel lines 120 are removed, the portions of spacer layer 130 (in FIG. 2) that are left behind are labeled as spacers 135, and can remain attached to the hardmask layer 110.

Figure 5:
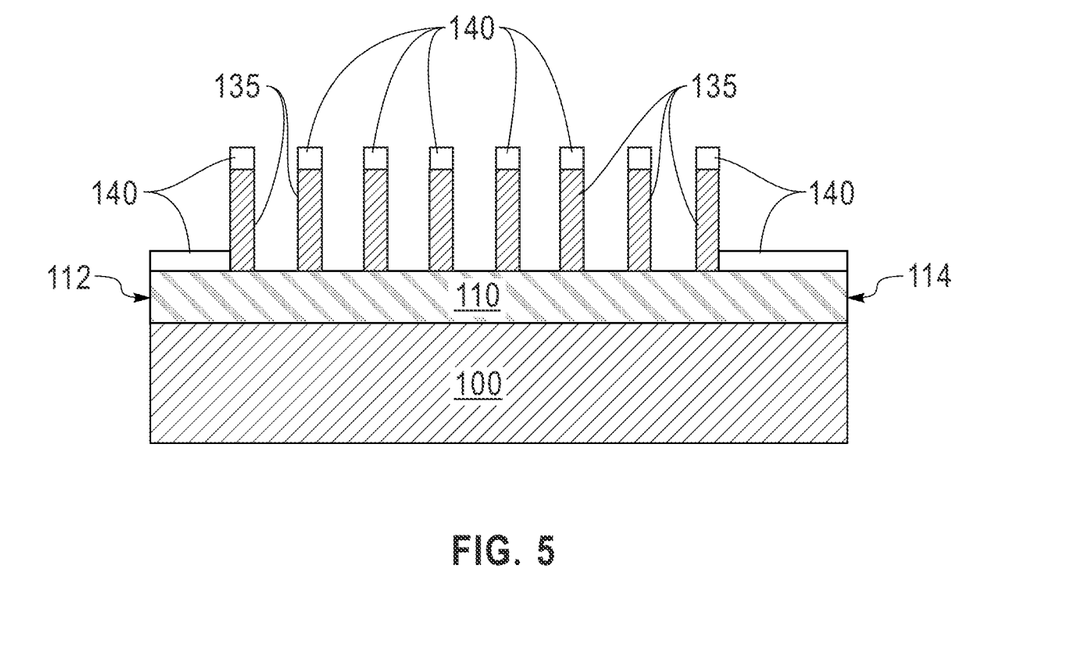
FIG. 5 is a cross-sectional schematic view illustrating a process operation following that of FIG. 4.

FIG. 5 shows the next operation in the method after that of FIG. 4, which shows a non-conformal film 140 coating top portions 136 (see FIG. 4) of each spacer 135 and coating first and second side portions 112, 114 of the hardmask layer 110, which are located outward relative to the plurality of spacers. Examples of materials that can be used for the non-conformal film 140 include silicon nitride, silicon oxynitride and silicon carbon nitride, for example, although other suitable materials are also contemplated. One feature and advantage of the non-conformal film 140 is to protect portions of the structure during the next operation in which the hardmask layer 110 is etched.

Figure 6:
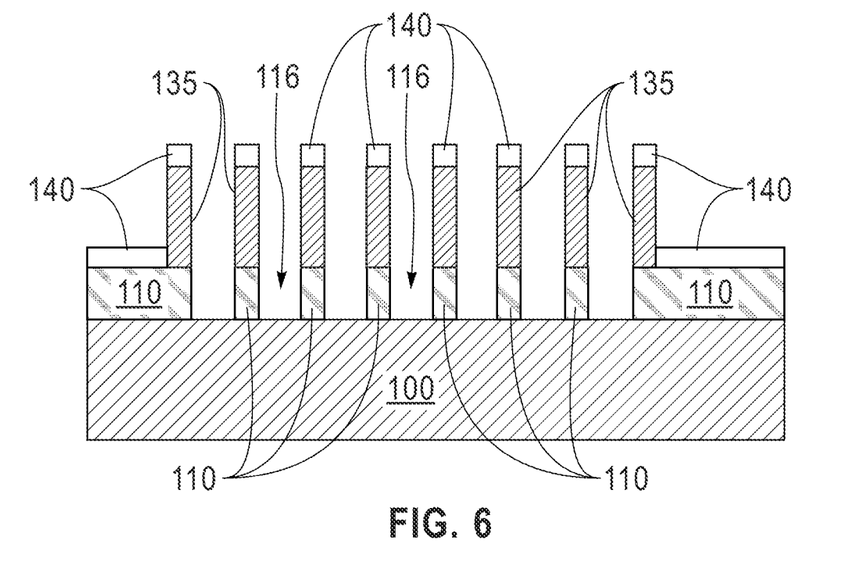
FIG. 6 is a cross-sectional schematic view illustrating a process operation following that of FIG. 5.

FIG. 6 shows the hardmask layer 110, after being etched. The areas of the hardmask layer 110 that were etched away are etched areas 116. The etched areas 116 of the hardmask layer 110 that were etched away were not covered or protected by the non-conformal film 140. The etched areas 116 extend linearly along the hardmask layer 110, and are located between spacers 135, and can generally be distributed equally, although other spacing is contemplated. A process that can be used to etch the hardmask layer 110, as shown, is reactive ion etching (RIE), otherwise known as plasma etching. For a metallic hardmask layer, such as titanium nitride (TiN), a chloride-based plasma can be used to etch or "open" the hardmask layer 110.

Figure 7:
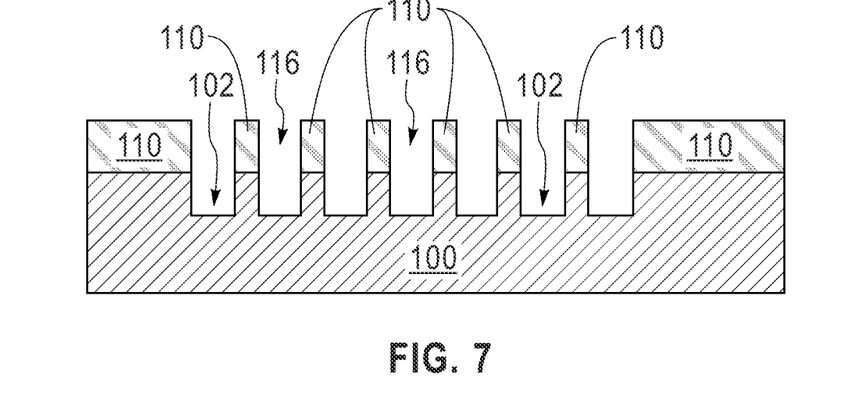
FIG. 7 is a cross-sectional schematic view illustrating a process operation following that of FIG. 6.
Figure 8:
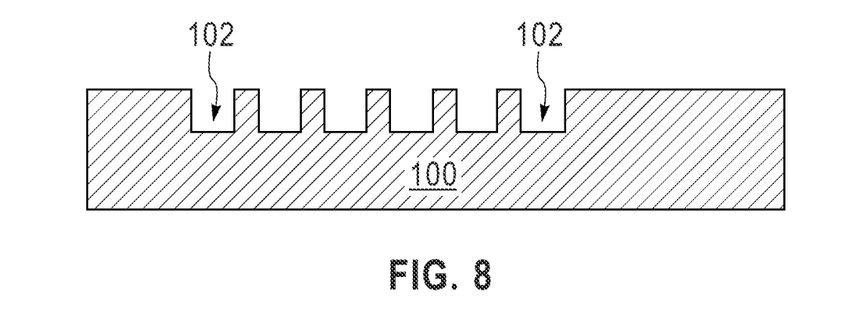
FIG. 8 is a cross-sectional schematic view illustrating a process operation following that of FIG. 7.

FIG. 7 shows the next operation after FIG. 5, in which the interlayer dielectric layer 100 is etched away under the etched areas 116 of the hardmask layer 110 (or where the interlayer dielectric layer 100 was exposed by the etching of the hardmask layer 110). A plurality of trenches 102 result and are shown etched into the interlayer dielectric layer 100. The process used to etch the plurality of trenches 102 into the interlayer dielectric layer 100 can be RIE using a fluorine-based plasma, although other suitable processes are contemplated. Next, FIG. 8 shows the remainder of hardmask layer 110 (remaining in FIG. 7) as removed from the interlayer dielectric layer 100. The remainder of the hardmask layer 110 can be removed using an isotropic etching process, such as a dye (plasma) or wet etch process. A wet process can minimize damage to any exposed areas of the interlayer dielectric layer 100 though, such as in the plurality of trenches 102.

Figure 9:
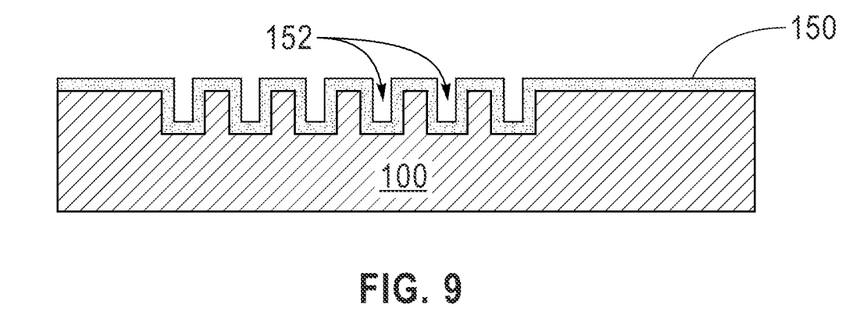
FIG. 9 is a cross-sectional schematic view illustrating a process operation following that of FIG. 8.

FIG. 9 shows the next operation after FIG. 8, which is a first layer, of a sandwich structure (or stack) of the MIM capacitor, being laid down. The first layer applied is a capacitor bottom metal (CBM) layer, plate or electrode 150. CBM layer 150 is a first metal layer and can be formed by a procedure or procedures including conformally depositing, photolithography, and etching processes. The deposition processes can include CVD, physical vapor deposition (PVD), ALD, or applicable methods. The photolithography processes can include photoresist coating (e.g., spin-on coating), soft baking, mask aligning, exposure, post-exposure baking, developing the photoresist, rinsing, and drying (e.g., hard baking). The etching processes can include dry etching, wet etching, and/or other etching methods. CBM layer 150 is generally conformally applied and follows a topography established by the plurality of trenches 102 (FIG. 8) in interlayer dielectric layer 100, which were formed in the preceding operations of the disclosed method. A plurality of trenches in the CBM layer 150 are labeled as 152, and correspond in number and size to the plurality of trenches 102 (see FIG. 8) in dielectric layer 100.

Figure 10:
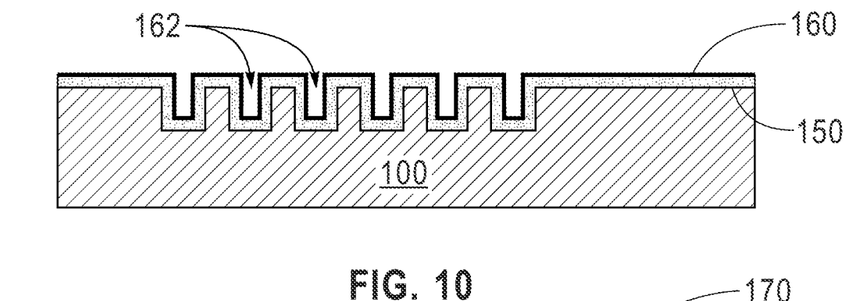
FIG. 10 is a cross-sectional schematic view illustrating a process operation following that of FIG. 9.
Figure 11:
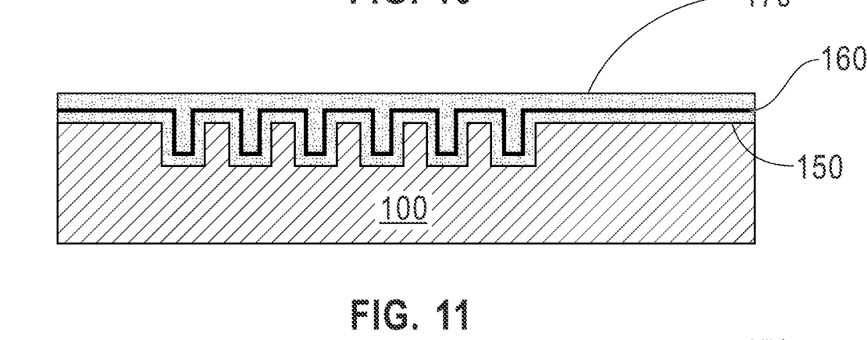
FIG. 11 is a cross-sectional schematic view illustrating a process operation following that of FIG. 10.

FIGS. 10 and 11 show the second and third layers of the sandwich structure deposited. The second layer is a capacitor insulating layer or film 160 that is generally conformally deposited on an upper surface of the CBM layer 150 and is located between the CBM layer 150 and a capacitor top metal (CTM) layer, plate or electrode 170, which is the third layer of the sandwich structure of the capacitor. The insulating layer 160 follows the topography of the CBM layer 150, and includes a corresponding plurality of trenches, labeled as 162 (see FIG. 10), that correspond in size and number to the plurality of trenches 152 in the CBM layer 150. The capacitor insulating layer 160 can comprise a high-k material that can include layers of hafnium oxide, zirconium oxide, and aluminum oxide, for example, that can be applied using known methods. Other suitable materials are also contemplated. The CTM layer 170 can be formed on an upper surface of the capacitor insulating layer 160 by similar procedures to those used to form the CBM layer 150, including depositing, photolithography, and etching processes.

Figure 12:
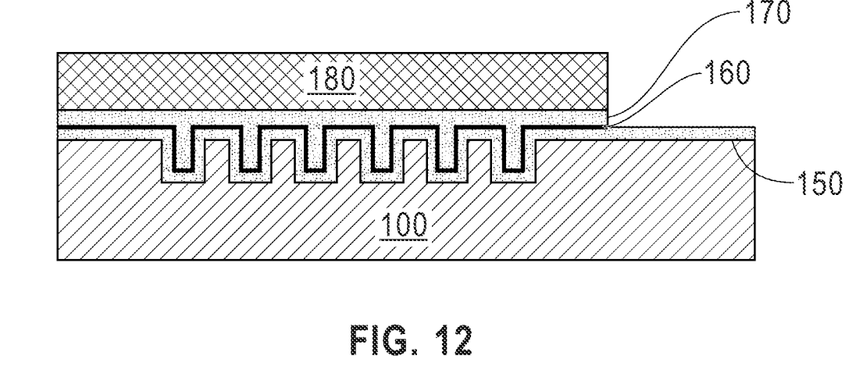
FIG. 12 is a cross-sectional schematic view illustrating a process operation following that of FIG. 11.

FIG. 12 shows a block mask layer 180 formed on at least a portion of an upper surface of the CTM layer 170. The block mask layer 180 is used to protect a portion of the CTM layer 170 during a subsequent etching process. The subsequent etching process removes the CTM layer 170 and the capacitor insulating layer 160 which are not covered by the block mask layer 180, as shown. The block mask layer 180 can be a photoresist layer or an optical planarization layer (OPL), for example.

Figure 13:
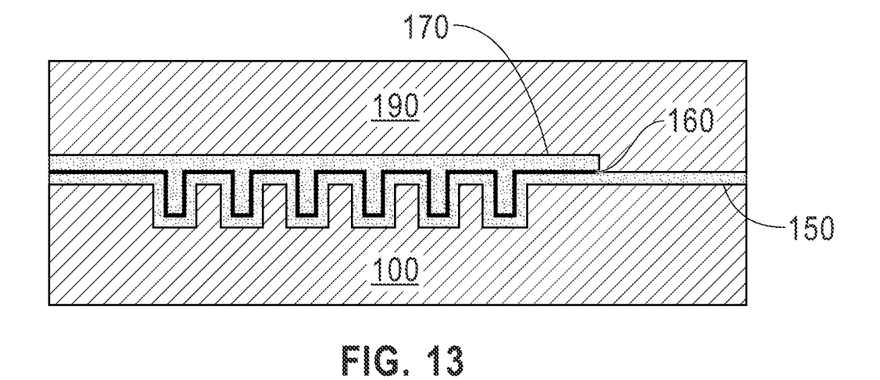
FIG. 13 is a cross-sectional schematic view illustrating a process operation following that of FIG. 12.

FIG. 13 shows a low-k material layer 190 deposited on the CTM layer 170, which was applied after the block mask layer 180 was removed. Example low-k materials that can be used for the low-k material layer 190 include carbon doped oxide dielectrics comprised of silicon, carbon, oxygen and hydrogen (SiCOH), which can have a dielectric constant between about 2.7 and 3.0. Low-k dielectric materials can be deposited by CVD processes, for example.

Figure 14:
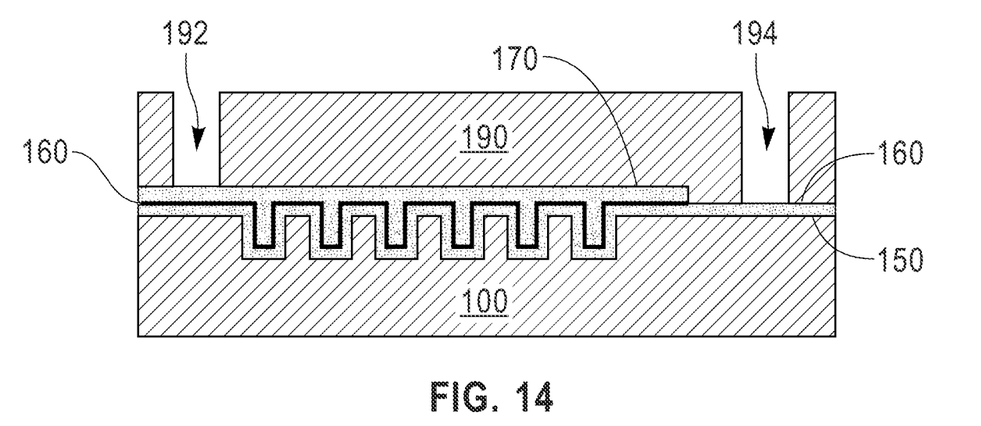
FIG. 14 is a cross-sectional schematic view illustrating a process operation following that of FIG. 13.

FIG. 14 follows the operations of FIG. 13, and shows a creation of first and second vias 192, 194 in low-k material layer 190, which are formed by a process called "patterning." The vias 192, 194 can be formed using RIE processes, for example.

Figure 15:
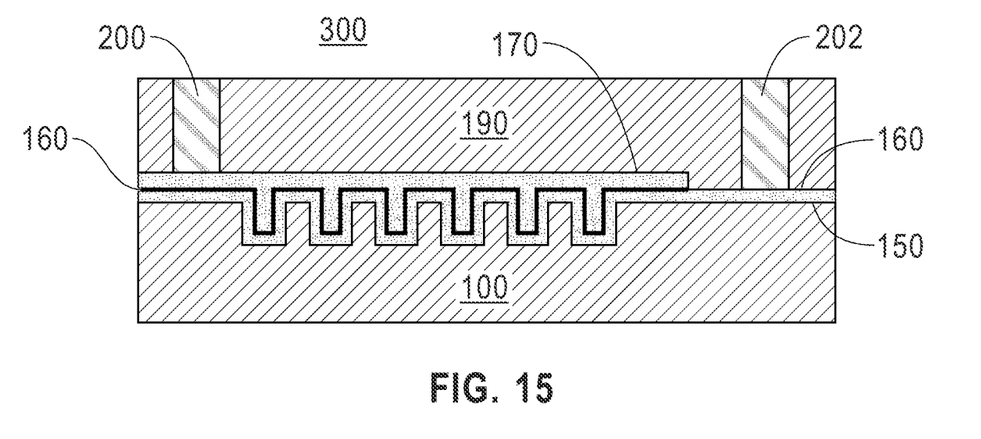
FIG. 15 is a cross-sectional schematic view illustrating the inventive MIM capacitor following a possible final process operation of the method of fabrication.

FIG. 15 shows the vias 192, 194 subsequently filled with a conductive material, such as a metal. Such metal lines 200, 202 (or electrodes) can be made of conductive material, including copper, aluminum, tungsten, ruthenium, niobium, molybdenum, or other applicable materials. In some embodiments, metal lines 200, 202 are copper or copper alloy. In some embodiments, metal lines 200, 202 are formed by single and/or dual damascene processes. Metal lines 200, 202 serve to electrically connect the CBM layer 150 to the CTM layer 170. The MIM capacitor 300 in FIG. 15 can be further incorporated into, or electrically connected to, a semiconductor device (not shown).

FIG. 15 also shows a finished MIM capacitor 300 fabricated using the method operations described above with regard to FIGS. 1-15. The MIM capacitor 300 includes a bottom capacitor plate 150 that includes a plurality of trenches 152 (see FIG. 9) defined therein. The MIM capacitor 300 also includes a top capacitor plate (i.e., CTM layer) 170 and a capacitor insulating layer 160 disposed between the top and bottom capacitor plates 170 (i.e. CTM layer), 150 (i.e., CBM layer). The plurality of trenches 152 in the bottom capacitor plate 150 correspond to the plurality of trenches 162 (FIG. 10) in capacitor insulating layer 160. The top capacitor plate 170 (i.e. CTM layer) fills in the plurality of trenches 162, such that the capacitor insulating layer 160 is formed into the plurality of spaced, parallel trenches 162 extending in an elongated direction in the capacitor 300 (although not visible in such a way in FIG. 15), which increases or enlarges the capacitor's 300 effective capacitive area. A first electrode 202 is electrically connected to the bottom capacitor plate 150, and a second electrode 200 is electrically connected to the top capacitor plate 170 (i.e. CTM layer). The MIM capacitor 300 can also include a dielectric layer 100, wherein the bottom capacitor plate 150 is formed on an upper surface of the dielectric layer 100 and within a plurality of corresponding trenches 102 (FIG. 7) in the dielectric layer 100. The plurality of trenches 152 of the bottom capacitor plate 150 can extend a depth into the plurality of corresponding trenches 102 in the dielectric layer 100. The depth can be increased in order to increase capacitance density of the MIM capacitor 300. The capacitance density of the MIM capacitor 300 can, therefore, be adapted by modulating depth of the plurality of trenches 102 of the dielectric layer 100, the plurality of trenches 152 of the bottom capacitor plate 150, and the plurality of trenches 162 of the capacitor insulating layer 160. The capacitance density of the MIM capacitor 300 can also be varied by modulating the number of trenches in the plurality of trenches 102, 152, 162. The plurality of trenches 152 can be configured to enlarge an effective area of the MIM capacitor, while the footprint of the MIM capacitor 300 can be minimized.

Another embodiment of the disclosure is a method of fabricating a MIM capacitor 300 with a desired capacitance density. The method includes an operation of forming a bottom capacitor plate 150 over an upper surface 101 of a dielectric layer 100 including a plurality of trenches 152 defined therein, wherein the plurality of trenches 152 are configured to provide the desired capacitance density of the MIM capacitor 300. A top capacitor (i.e. CTM layer) 170 is provided, and a capacitor insulating layer 160 is disposed between the top and bottom capacitor plates 170 (i.e. CTM layer), 150 (i.e. CBM layer) and within the plurality of trenches 152. A first electrode 202 is electrically connected to the bottom capacitor plate 150, and a second electrode 200 is electrically connected to the top capacitor plate 170 (i.e. CTM layer). A depth of the plurality of trenches 152, 162 can be adapted to provide the desired capacitance density of the MIM capacitor 300. Also, the number of trenches in the plurality of trenches 152, for example, can be changed to provide the desired capacitance density of the MIM capacitor 300.

For purposes of this description, certain aspects, advantages, and novel features of the embodiments of this disclosure are described herein. The disclosed methods, and systems should not be construed as being limiting in any way. Instead, the present disclosure is directed toward all novel and nonobvious features and aspects of the various disclosed embodiments, alone and in various combinations and subcombinations with one another. The methods, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially can in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms can vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises."

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of fabricating a metal-insulator-metal (MIM) capacitor comprising:
   providing a dielectric layer;
   forming a hardmask layer on an upper surface of the dielectric layer;
   forming a plurality of mandrel lines on the upper surface of the hardmask layer;
   forming a conformal layer over the plurality of mandrel lines and the hardmask layer;
   etching portions of the conformal layer from top portions of the plurality of mandrel lines and from any portion of the hardmask layer that is exposed, wherein other portions of the conformal layer that remain on the hardmask layer form a plurality of spacers;
   removing the plurality of mandrel lines;
   forming a non-conformal layer on top portions of the plurality of spacers and on portions of the hardmask layer which are located outward relative to the plurality of spacers;
   etching portions of the hardmask layer located between the plurality of spacers;
   etching portions of the dielectric layer located between the plurality of spacers to form a plurality of trenches in the dielectric layer;
   removing the hardmask layer from the dielectric layer;
   forming a bottom capacitor plate over the upper surface of the dielectric layer, the bottom capacitor plate including the plurality of trenches defined therein, wherein the plurality of trenches are configured to provide a desired capacitance density of the MIM capacitor;
   providing a top capacitor plate; and
   disposing a capacitor insulating layer between the top and bottom capacitor plates and within the plurality of trenches.

2. The method of claim 1, further comprising:
   electrically connecting a first electrode to the bottom capacitor plate; and
   electrically connecting a second electrode to the top capacitor plate.

3. The method of claim 1, wherein the plurality of trenches have a depth adapted to achieve a desired capacitance density of the MIM capacitor.

4. The method of claim 1, wherein a number of trenches in the plurality of trenches is configured to provide a desired capacitance density of the MIM capacitor.

5. The method of claim 1, wherein the plurality of trenches are configured to enlarge an area of the MIM capacitor.

6. A method of fabricating a metal-insulator-metal (MIM) capacitor comprising:

providing a dielectric layer;

forming a hardmask layer on an upper surface of the dielectric layer;

forming a plurality of mandrel lines on an upper surface of the hardmask layer;

forming a conformal layer over the plurality of mandrel lines and the hardmask layer;

etching portions of the conformal layer from top portions of the plurality of mandrel lines and from any portion of the hardmask layer that is exposed, wherein other portions of the conformal layer that remain on the hardmask layer form a plurality of spacers;

removing the plurality of mandrel lines;

forming a non-conformal layer on top portions of the plurality of spacers and on top portions of the hardmask layer which are located outward relative to the plurality of spacers;

etching portions of the hardmask layer located between the plurality of spacers;

etching portions of the dielectric layer located between the plurality of spacers to form a plurality of trenches in the dielectric layer;

removing the hardmask layer from the dielectric layer;

forming a bottom capacitor layer over the upper surface of the dielectric layer and within the plurality of trenches;

forming an insulating layer on an upper surface of the bottom capacitor layer;

forming a top capacitor layer on an upper surface of the insulating layer, wherein the top capacitor layer fills the plurality of trenches;

forming a first electrode electrically connected to the bottom capacitor layer; and forming a second electrode electrically connected to the top capacitor layer.

7. The method of claim 6, further comprising:

forming a block mask to cover a first portion of an upper surface of the top capacitor layer; and etching a second portion of the top capacitor layer and the insulating layer which are not covered by the block mask.

* * * * *